(12) United States Patent
Guégan

(10) Patent No.: US 8,680,649 B2
(45) Date of Patent: Mar. 25, 2014

(54) MULTI-LAYER FILM CAPACITOR WITH TAPERED FILM SIDEWALLS

(75) Inventor: Guillaume Guégan, Tours (FR)

(73) Assignee: STMicroelectronics (Tours) SAS, Tours (FR)

(*) Notice: Subject to any disclaimer, the term of this patent is extended or adjusted under 35 U.S.C. 154(b) by 769 days.

(21) Appl. No.: 12/196,517

(22) Filed: Aug. 22, 2008

(65) Prior Publication Data
US 2010/0044831 A1 Feb. 25, 2010

(51) Int. Cl.
*H01L 29/92* (2006.01)

(52) U.S. Cl.
USPC ........... 257/532; 257/535; 257/303; 257/306; 257/E21.648; 257/E29.026; 257/E21.649; 438/396

(58) Field of Classification Search
USPC ........ 361/278, 301.4, 303, 306.1, 306.3, 307, 361/308.1, 308.3, 311–313, 321.1–321.5, 361/322, 328–330, 393, 619, 691, 321.4; 257/306–310, E29.343, 303, 535, 257/E29.001, E29.026, E21.648, E21.649, 257/532; 438/396, 244, 250, 253, 381, 387, 438/393
See application file for complete search history.

(56) References Cited

U.S. PATENT DOCUMENTS

| | | | | |
|---|---|---|---|---|
| 3,969,197 A | * | 7/1976 | Tolar et al. | 205/122 |
| 5,745,335 A | * | 4/1998 | Watt | 361/313 |
| 6,064,108 A | * | 5/2000 | Martinez | 257/532 |
| 6,411,494 B1 | * | 6/2002 | Watt | 361/306.3 |
| 7,504,680 B2 | * | 3/2009 | Arisumi et al. | 257/293 |
| 2001/0041416 A1 | * | 11/2001 | Torii et al. | 438/396 |
| 2006/0231876 A1 | * | 10/2006 | Arisumi et al. | 257/295 |
| 2006/0240577 A1 | * | 10/2006 | Ashikaga | 438/3 |
| 2007/0108553 A1 | * | 5/2007 | Kuwajima et al. | 257/532 |
| 2008/0145996 A1 | * | 6/2008 | Nomura et al. | 438/396 |
| 2013/0270675 A1 | * | 10/2013 | Childs et al. | 257/532 |

* cited by examiner

*Primary Examiner* — Alexander Sofocleous
*Assistant Examiner* — John P Dulka
(74) *Attorney, Agent, or Firm* — Wolf, Greenfield & Sacks, P.C.

(57) ABSTRACT

A multi-layer capacitor of staggered construction is formed of one or more layers having tapered sidewall(s). The edge(s) of the capacitor film(s) can be etched to have a gentle slope, which can improve adhesion of the overlying layers and provide more uniform film thickness. The multi-layer capacitor can be used in various applications such as filtering and decoupling.

19 Claims, 7 Drawing Sheets

MULTI-LAYER FILM CAPACITOR WITH TAPERED FILM SIDEWALLS

BACKGROUND OF THE INVENTION

1. Field of the Invention

The techniques described herein relate to multi-layer film capacitors.

2. Discussion of the Related Art

Multi-layer film capacitors are known and have been used in applications such as filtering and power decoupling for integrated circuits. U.S. Pat. No. 5,745,335, entitled "Multi-Layer Film Capacitor Structures and Method" by Watt (hereinafter "Watt") describes two different types of film capacitors. FIGS. 1-17 of Watt show a multi-layer film capacitor having a mesa structure, in which each upper layer is progressively smaller in area, and each upper layer fits within the perimeter of the lower layers. FIG. 18 of Watt shows a different multi-layer film capacitor having a staggered construction, in which some of the upper layers overhang the lower layers. Watt states that the staggered capacitor structure has several disadvantages compared to the mesa structure (Col. 12, lines 13-20). For example, in the staggered structure, the corners of the underlying films can cause problems when depositing films on top of them. Also, some areas may be too thick for suitable film adhesion. Additionally, the locations that can potentially be used for contact areas are more restricted. A further disadvantage is that the staggered structure can have increased parasitic capacitance problems. Thus, Watt states that the mesa structure is preferred over the staggered structure (Abstract).

SUMMARY OF THE INVENTION

An advantage of the staggered multi-layer capacitor structure over the mesa structure is that the staggered structure can be easier to manufacture. In some embodiments, staggered multi-layer film capacitors can be improved by tapering the edges of at least one film layer. Previous multi-layer capacitors, like those described in Watt, had films with vertical (or quasi-vertical) sidewalls that could cause problems when depositing overlying films. Vertical or quasi-vertical film sidewalls are the norm in semiconductor manufacturing, because layer patterning techniques are typically optimized to make film edges as close to vertical as possible to obtain high feature resolution. In some aspects, tapering the film edge(s) of a multi-layer capacitor can facilitate the deposition of overlying films, and can allow the capacitor films have a more constant thickness than prior staggered multi-layer film capacitors. Thus, in accordance with some embodiments, one or more of the disadvantages of prior staggered multi-layer capacitors can be reduced.

Some embodiments relate to a multi-layer capacitor formed above an integrated circuit substrate. A first electrode layer may have a tapered sidewall formed at its edge. A first dielectric may be formed on the first electrode layer and the tapered sidewall. A second electrode layer may be formed on the first dielectric layer.

Some embodiments also relate to a multi-layer capacitor formed above an integrated circuit substrate. The capacitor may include a first electrode layer and a first dielectric layer at least formed on the first electrode layer. The first dielectric layer may have a tapered sidewall formed at its edge. A second electrode layer may be formed on the first dielectric layer and the tapered sidewall.

Some embodiments relate to a method of forming a multi-layer capacitor. A first electrode layer may be formed over a substrate, and a first dielectric layer may be formed on the first electrode layer. A portion of the first electrode layer and/or the first dielectric layer may be removed to form a tapered sidewall. A second electrode layer may be formed over the tapered sidewall.

BRIEF DESCRIPTION OF THE DRAWINGS

The accompanying drawings are not intended to be drawn to scale. Vertical dimensions are exaggerated in size for clarity, as is conventional in the representation of integrated circuits. In the drawings, each identical or nearly identical component that is illustrated in various figures is represented by a like reference character. For purposes of clarity, not every component may be labeled in every drawing. In the drawings.

DETAILED DESCRIPTION

The embodiments described herein relate to a multi-layer film capacitor in which one or more of the capacitor films has tapered sidewall(s). Typical integrated circuit manufacturing technologies pattern deposited films to have sharp vertical or quasi-vertical sidewalls. Sharp film sidewalls may cause problems when another layer is deposited over the sidewall, as can be the case when forming a staggered multi-layer capacitor. Forming upper film layers over a sharp film sidewall can lead to irregular film thickness, adhesion problems, and/or constrained step coverage. In some embodiments, multi-layer capacitor film edge(s) can be tapered to have a gentle slope, which can improve film adhesion and film thickness uniformity, so that breakdown voltage uniformity is improved and stress induced cracks are avoided. Other advantages that can be achieved include an increase in integration density and better acoustic resonance management. Advantageously, in some embodiments, tapered film edges may be formed during an etching step for patterning a capacitor film, without adding significant manufacturing process complexity.

Figure 1:
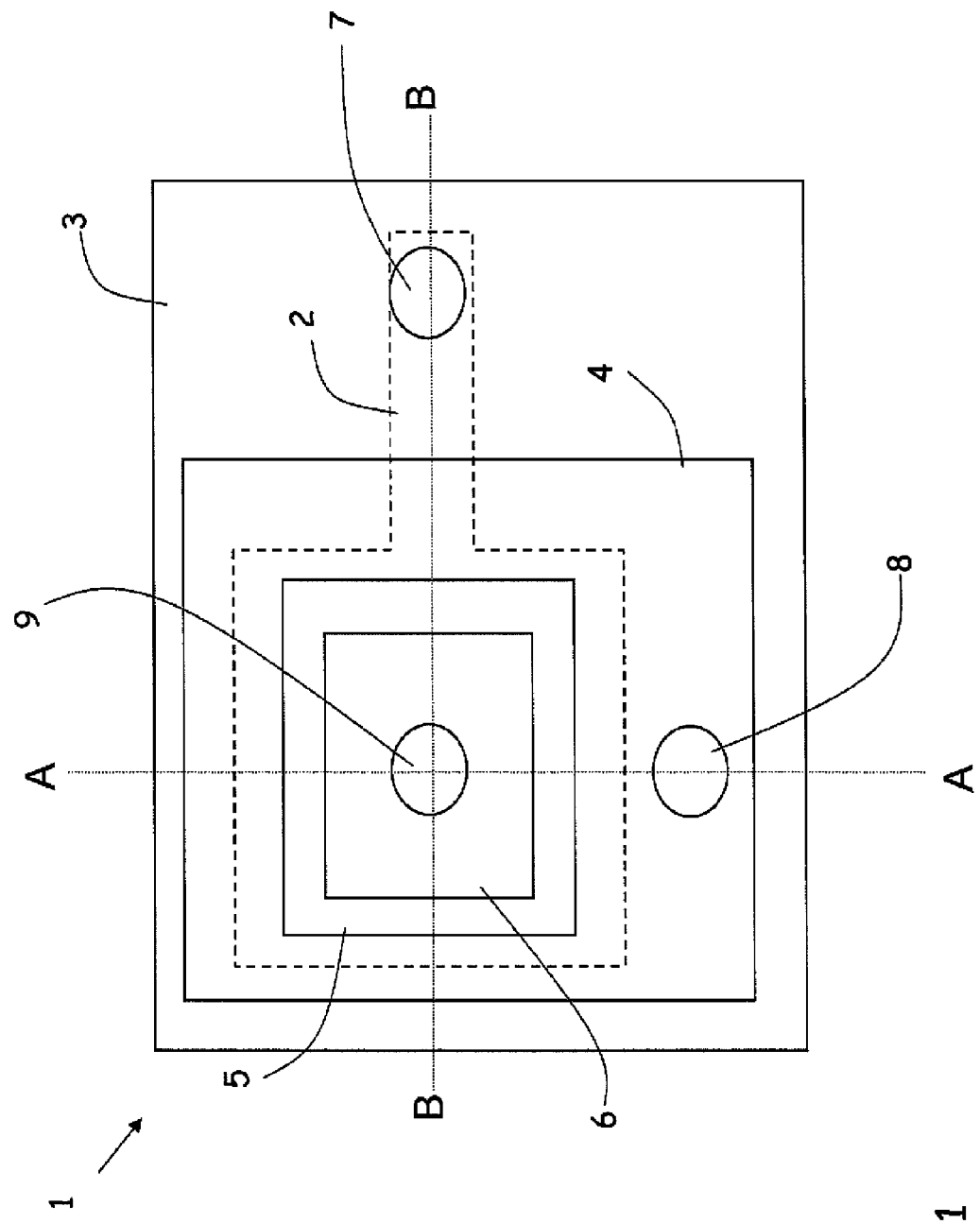
FIG. 1 shows a top view of a multi-layer film capacitor, according to some embodiments.

FIG. 1 shows a top-view diagram of a staggered multi-layer capacitor 1, according to some embodiments. The staggered multi-layer capacitor 1 includes a first electrode 2, a first dielectric 3 on top of first electrode 2, a second electrode 4 formed on top of first dielectric 3, a second dielectric 5 formed on top of second electrode 4, and a third electrode 6 formed on top of second dielectric 5. Contacts holes 7, 8 and 9 can be used to make contact to electrodes 2, 4, and 6, respectively. As shown in FIG. 1, a portion of electrode 2 may extend beyond the perimeter of electrode 4 (along the line B-B in FIG. 1) so that contact can be made to electrode 2 through contact hole 7. Portions of electrode 4 may extend beyond electrode 2 (along the line A-A in FIG. 1). Portions of dielectric 3 may extend beyond the perimeter of electrode 2 and the perimeter of electrode 4. Thus, staggered multi-layer capacitor 1 has a staggered structure in which connections to different lower electrodes can be made on different sides on the capacitor (staggered around the capacitor) by allowing the electrodes to extend in different directions towards their respective contact holes.

Figure 2:
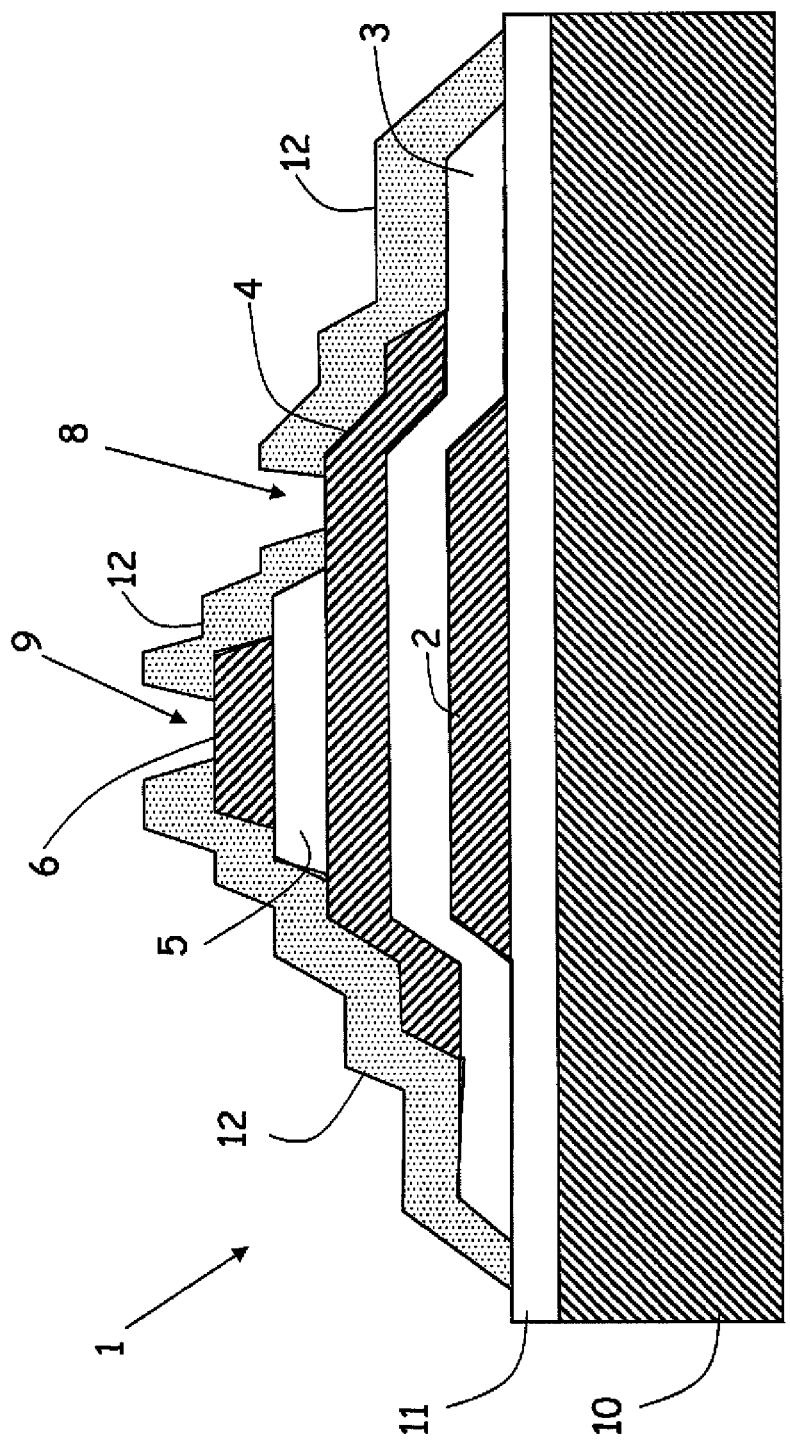
FIG. 2 shows a cross-sectional view of the multi-layer film capacitor of FIG. 1 along the line A-A of FIG. 1.
Figure 3:
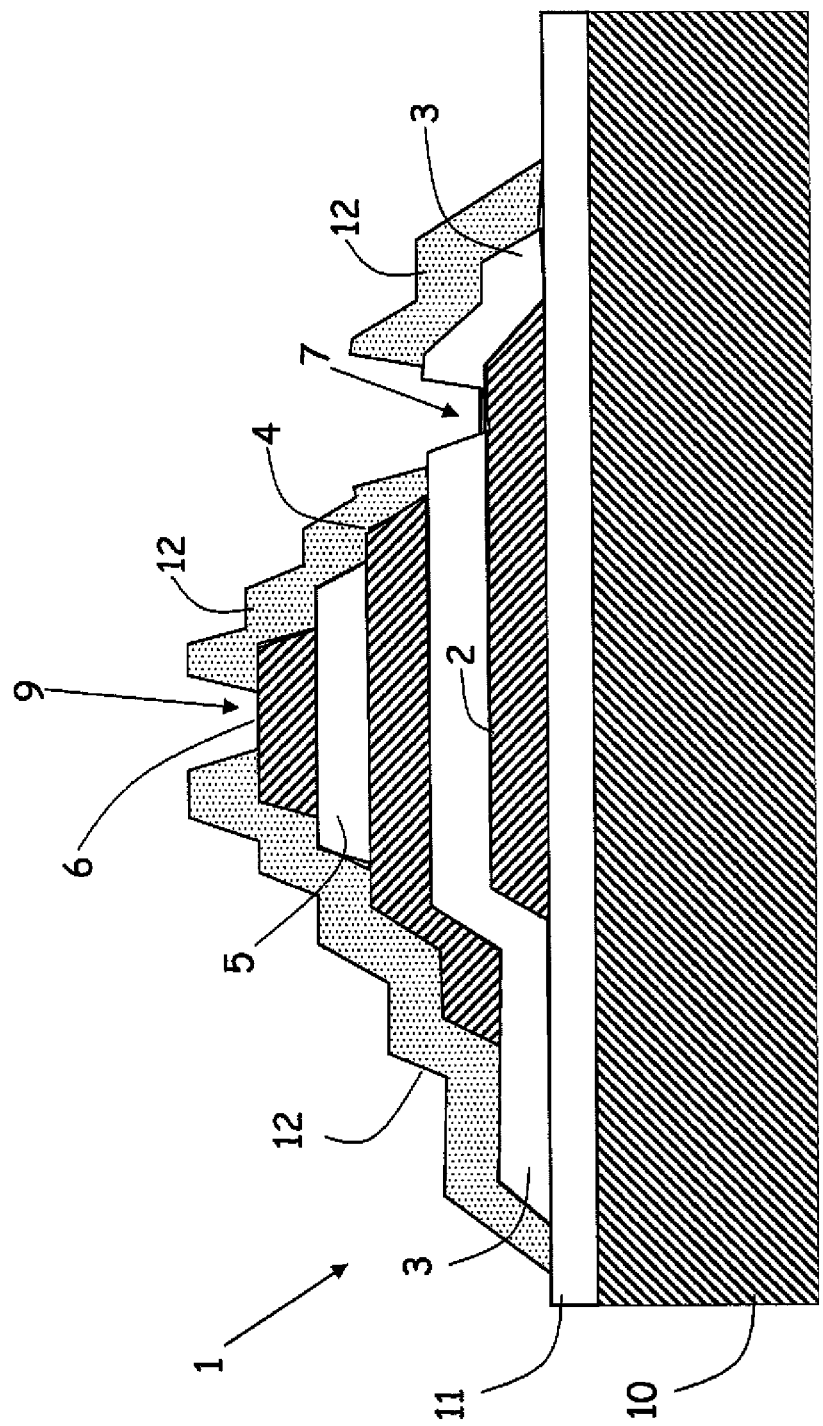
FIG. 3 shows another cross-sectional view of the multi-layer film capacitor of FIG. 1 along the line B-B of FIG. 1.

FIG. 2 shows a cross-sectional view of staggered multi-layer capacitor 1 along the line A-A of FIG. 1. In some embodiments, staggered multi-layer capacitor 1 is formed on an insulating layer 11 above a substrate 10. Any suitable insulating material can be used for insulating layer 11, such as $SiO_2$, for example. Substrate 10 can be formed of silicon, or any other suitable material. The capacitor electrodes and dielectric layers 2-6 can be successively formed on and above insulating layer 11 in any suitable way, as discussed in further detail below with respect to FIG. 4. Capacitor electrodes 2, 4 and 6 can be formed of any suitable conductive material, such as platinum (Pt), or an oxide of ruthenium or iridium, for example. Capacitor dielectrics 3 and 5 can be formed of any suitable dielectric material, such as barium-strontium titanate (BST), having chemical formula $BaTiO_3$—$SrTiO_3$. However, other material may be used for the electrode and dielectric layers, as the invention is not limited any materials in particular. In some embodiments, the thickness of any of electrodes 2, 4 and 6 may be on the order of 500 nm, such as between 100 nm and 750 nm, and the thickness of the dielectric layer may be on the order of 300 nm, such as between 150 nm and 450 nm, for example. Although the embodiments illustrated in FIGS. 1-3 show a multi-layer capacitor having three electrode layers and two dielectric layers, more or fewer layers may be used. In some embodiments, two or more of the electrodes may be coupled to one another in series and/or parallel in various ways to obtain various capacitance values, for example.

An upper passivation layer 12 may be formed on top of layers 2-6 to protect the capacitor from the surrounding environment. Upper passivation layer 12 can be formed of any suitable material such as $SiO_2$ or TEOS (tetraethyl orthosilicate), for example. FIG. 2 also shows that contact holes may be formed in the upper passivation layer 12 for making contact between the electrodes and other circuitry. For example, contact hole 8 may be formed through upper passivation layer 12 so that contact can be made to electrode 4. Contact hole 9 may be formed through upper passivation layer 12 so that contact can be made to electrode 6.

According to previous techniques, the film sidewalls for multi-layer capacitors were intentionally etched to be vertical or quasi-vertical. In accordance with some embodiments, the sidewall(s) of one or more of the capacitor films can be tapered at the film edge. The film edge(s) may have a gradual, tapered downward slope, such that the tapered portion has a downward angle of greater than about 10°, such as between 30° and 60° (preferably between 40° and 50°), with respect to the horizontal dimension of FIGS. 2 and 3, parallel to the capacitor layers and substrate. One or several of the capacitor films may have tapered sidewalls.

FIG. 3 shows another cross-sectional view of the staggered multi-layer capacitor of FIG. 1 along the line B-B of FIG. 1. As shown in FIG. 3, a portion of dielectric layer 3 extends beyond the perimeter of electrode 2. A contact hole 7 may be formed through upper passivation layer 12 and dielectric layer 3 for making contact to electrode 2. A portion of electrode 4 may also extend beyond the perimeter of electrode 2, although on the right side of FIG. 3 no portion of electrode 4 extends over the area where contact hole 7 is to be formed, to facilitate connection to electrode 2.

Figure 4:
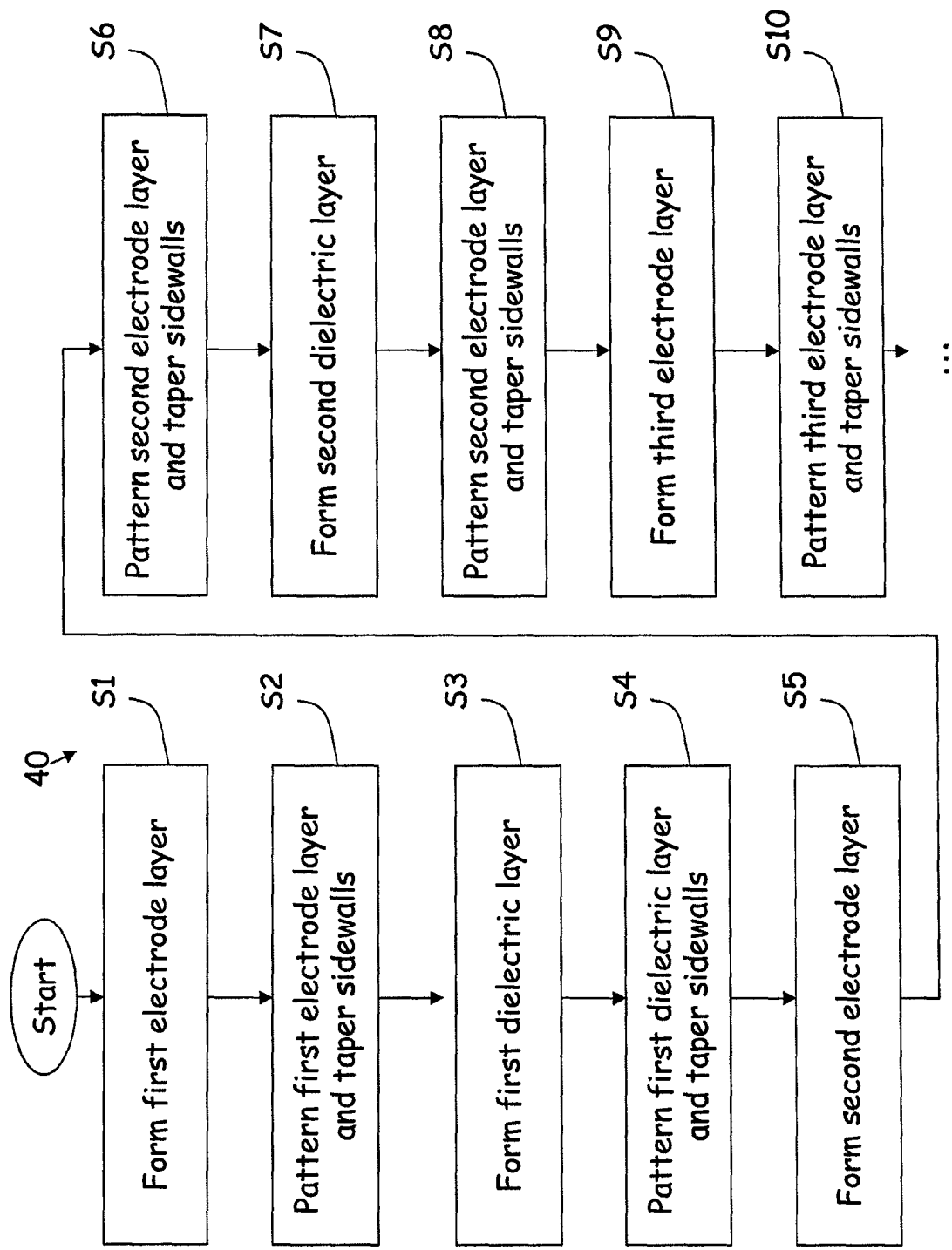
FIG. 4 is a flowchart showing a method of forming a multi-layer film capacitor, according to some embodiments.

FIG. 4 is a flowchart showing a method 40 of forming a multi-layer capacitor, according to some embodiments. Each capacitor layer may be formed by a blanket layer deposition step, and then the unwanted portion of the deposited layer may be removed by etching, such as plasma etching, to pattern the deposited layer into the desired shape. However, any suitable patterning or deposition technique may be used, as the invention is not limited in these respects.

In step S1, a first electrode layer 2 is formed. As shown in FIGS. 2 and 3, electrode layer 2 may be formed on insulating layer 11 above substrate 10. Any suitable deposition technique may be used to form the capacitor electrodes, such as sputtering, for example. After forming first electrode layer 2, a material removal step S2 may be performed to define the shape of the layer by removing unwanted deposited material and form tapered sidewalls. The sidewall(s) of one or more of the capacitor films can be tapered during the etching of each layer in which the unwanted material is removed. One of ordinary skill in the art will understand how to achieve such tapered sidewalls based on the techniques described herein. As one example, a new or uncalibrated plasma etching machine may be used to form tapered sidewalls, where the etching machine is not calibrated to produce vertical or quasi-vertical sidewalls. However, this is just one example, and any suitable technique may be used to form tapered film sidewalls. In some manufacturing processes, the electrode layers may have a smallest feature size of about 6 μm. However, this is just an example, and the invention is not limited as to a particular feature size.

In step S3, a first dielectric layer 3 is formed over first electrode layer 2. Dielectric layers 3 and 5 may be formed using any physical process such as sputtering, any chemical process such as sol-gel if BST or another sol-gel compatible material is used as the dielectric material or CUD, or any deposition process. After forming the dielectric layer 3, another material removal step S4 may be performed to remove the unwanted material of dielectric layer 3, and tapered sidewall(s) may be formed.

In step S5, a second electrode layer 4 is formed over the first dielectric layer 3, and in step S6 material is removed and tapered sidewalls may be formed. In steps S7 and S8, another dielectric layer 5 may be formed and patterned, and in steps S9 and S10, a third electrode layer 6 may be formed and patterned. Tapered sidewalls may also be formed as discussed above. Additional or fewer electrode and dielectric layers can be formed as desired, as the invention is not limited as to the number of layers used.

Additional steps (not shown) may also be performed. For example, after forming the last electrode layer, upper passivation layer 12 may be formed to protect the multi-layer capacitor. Then, one or more contact holes 7-9 may be formed through upper passivation layer 12 so that contact can be made to electrodes 2, 4 and 6. Any suitable manufacturing process may be used to form the contact holes, such as plasma etching, for example. In some embodiments, contact holes 7-9 may be about 2-3 μm in width.

Several additional embodiments of staggered multi-layer capacitors will now be described, with reference to FIGS. 5-7. These embodiments may be formed using any suitable manufacturing process, such as the method of FIG. 4, for example.

Figure 5:
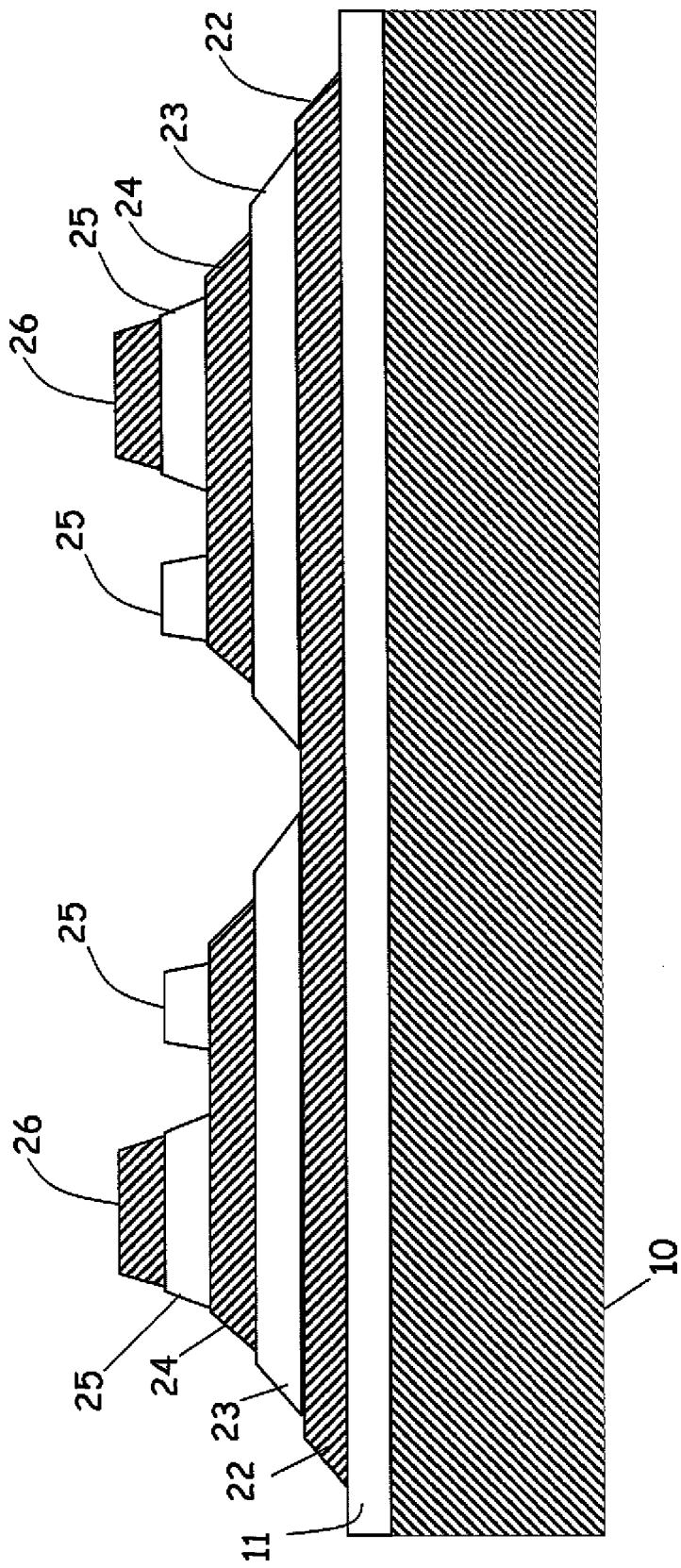
FIG. 5 shows another cross-sectional view of a multi-layer film capacitor, according to some embodiments.

FIG. 5 shows another cross-sectional view of a multi-layer capacitor according to some embodiments. As illustrated in FIG. 5, a contact hole to the bottom electrode may be formed near the center of the structure, and contacts to the upper electrodes may be formed farther away from center. The multi-layer capacitor includes a first electrode 22, a first dielectric 23 on top of first electrode 22, a second electrode 24 formed on top of first dielectric 23, a second dielectric 25 formed on top of second electrode 24, and a third electrode 26 formed on top of second dielectric 25. One or more of these layers, or all of the layers, may have tapered sidewalls as discussed above. A passivation layer (not shown) may be formed over the multi-layer capacitor, and suitable contact holes may be formed.

Figure 6:
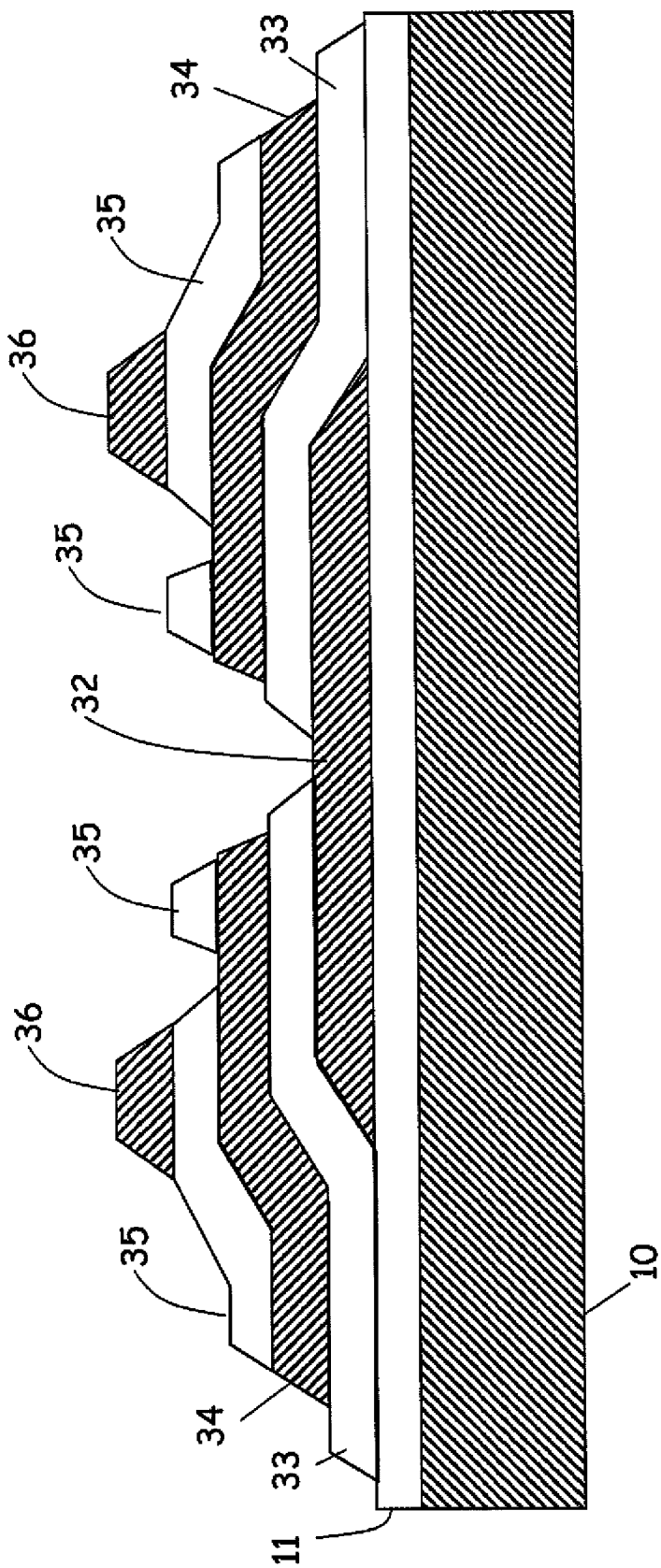
FIG. 6 shows yet another cross-sectional view of a multi-layer film capacitor, according to some embodiments.

FIG. 6 shows yet another cross-sectional view of a staggered multi-layer capacitor according to some embodiments. As with FIG. 5, contacts to the lower electrodes may be formed closer to the center of the capacitor structure. The multi-layer capacitor includes a first electrode 32, a first dielectric 33 on top of first electrode 32, a second electrode 34 formed on top of first dielectric 33, a second dielectric 35 formed on top of second electrode 34, and a third electrode 36 formed on top of second dielectric 35. As shown in FIG. 6, second electrode 34 may extend beyond the perimeter of first electrode 32.

Figure 7:
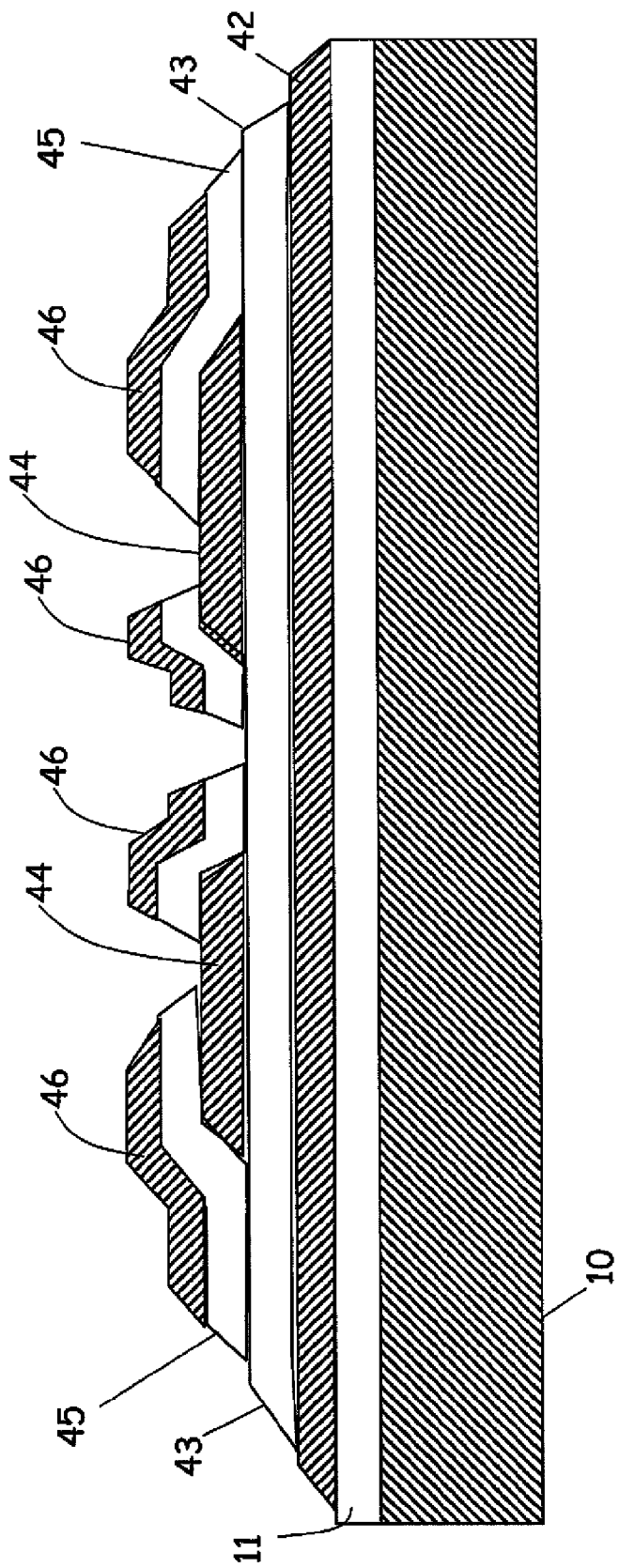
FIG. 7 shows a further cross-sectional view of a multi-layer film capacitor, according to some embodiments.

FIG. 7 shows a further cross-sectional view of a staggered multi-layer capacitor according to some embodiments. The multi-layer capacitor includes a first electrode 42, a first dielectric 43 on top of first electrode 42, a second electrode 44 formed on top of first dielectric 43, a second dielectric 45 formed on top of second electrode 44, and a third electrode 46 formed on top of second dielectric 45. Contact holes to the second electrode 44 may be formed through the second dielectric 45 and the third electrode 44.

In some embodiments, substrate 10 is a semiconductor substrate of an integrated circuit having a number of electrical devices. Multi-layer capacitor 1 may be connected to these devices to perform any of a variety of functions such as decoupling or filtering. On-chip connections between the capacitor and these devices may be made in any suitable way. In some embodiments, the multi-layer capacitor may be connected to off-chip circuitry for any suitable application.

Having now described some illustrative embodiments of the invention, it should be apparent to those skilled in the art that the foregoing is merely illustrative and not limiting, having been presented by way of example only. Numerous modifications and other embodiments may be contemplated by those of ordinary skill in the art and are believed to fall within the scope of the invention. In particular, many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments.

Use of ordinal terms such as "first," "second," "third," etc. in the claims to modify a claim element or item in the specification does not by itself connote any priority, presence or order of one element over another or the temporal order in which acts of a method are performed. Rather, these ordinal terms are used merely as labels to distinguish one element having a certain name from another element having a same name, but for the use of the ordinal term, to distinguish the elements.

What is claimed is:

1. A multi-layer capacitor formed above a substrate, the multi-layer capacitor comprising:
   a first electrode layer having a first tapered sidewall formed at an edge of the first electrode layer;
   a first dielectric layer at least partially formed over the first electrode layer and the first tapered sidewall of the first electrode layer, the first dielectric layer having a second tapered sidewall formed at an edge of the first dielectric layer, wherein the second tapered sidewall is staggered in position with respect to the first tapered sidewall;
   a second electrode layer at least partially formed over the first dielectric layer;
   a second dielectric layer formed at least partially over the second electrode layer; and
   a third electrode layer at least partially formed over the second dielectric layer,
   wherein the second dielectric layer has a third tapered sidewall at an edge of the second dielectric layer, and
   wherein the second electrode layer comprises a contact region that extends beyond a perimeter of the second dielectric layer, and a contact hole extends down to the contact region.

2. The multi-layer capacitor of claim 1, wherein the contact hole is a first contact hole and the contact region is a first contact region, and the multi-layer capacitor further comprises a second comprising a first contact hole that extends through the first dielectric layer to a second contact region of the first electrode layer.

3. The multi-layer capacitor of claim 1, wherein at least one of the first and second electrode layers has a thickness between 250 nm and 750 nm.

4. The multi-layer capacitor of claim 1, wherein the first dielectric layer has a thickness between 150 nm and 450 nm.

5. The multi-layer capacitor of claim 1,
   wherein the third electrode layer has a fourth tapered sidewall at an edge of the third electrode layer.

6. The multi-layer capacitor of claim 1, wherein the second electrode layer is at least partially formed on the second tapered sidewall of the first dielectric layer.

7. The multi-layer capacitor of claim 1, wherein a portion of the first dielectric layer extends beyond the perimeter of the first electrode layer.

8. The multi-layer capacitor of claim 1, wherein a portion of the second electrode layer extends beyond the perimeter of the first electrode layer.

9. The multi-layer capacitor of claim 1, wherein the tapered sidewall of the first electrode layer forms a downward angle of 30°-60° with respect to a surface of the integrated circuit substrate.

10. The multi-layer capacitor of claim 1, wherein a portion of the second electrode layer extends beyond the perimeter of the first electrode layer, and wherein the second electrode layer does not extend beyond the perimeter of the first dielectric layer.

11. The multi-layer capacitor of claim 1, further comprising:
    a passivation layer formed over the first, second and third tapered sidewalls.

12. A multi-layer capacitor formed over a substrate, the multi-layer capacitor comprising:
    a first electrode layer;
    a first dielectric layer at least partially formed over the first electrode layer, the first dielectric layer having a first tapered sidewall formed at an edge of the first dielectric layer;
    a second electrode layer at least partially formed over the first dielectric layer and the first tapered sidewall of the first dielectric layer, the second electrode layer having a second tapered sidewall formed at an edge of the second electrode layer, wherein the second tapered sidewall is staggered in position with respect to the first tapered sidewall;
    a second dielectric layer formed at least partially over the second electrode layer;
    a third electrode layer at least partially formed over the second dielectric layer; and a contact hole over the third electrode layer extending down to the third electrode layer, wherein the third electrode layer has a third tapered sidewall at an edge of the third electrode layer.

13. The multi-layer capacitor of claim 12, wherein the first electrode layer has a tapered sidewall formed at an edge of the first electrode layer.

14. The multi-layer capacitor of claim 12, wherein a portion of the first dielectric layer extends beyond the perimeter of the first electrode layer.

15. The multi-layer capacitor of claim 12, wherein a portion of the second electrode layer extends beyond the perimeter of the first electrode layer, and wherein the second electrode layer does not extend beyond the perimeter of the first dielectric layer.

16. The multi-layer capacitor of claim 12, further comprising:

a passivation layer formed over the first, second and third tapered sidewalls.

17. A multi-layer capacitor formed over a substrate, the multi-layer capacitor comprising:

a first electrode layer having a first tapered sidewall;

a first dielectric layer having a second tapered sidewall that is staggered in position with respect to the first tapered sidewall;

a second electrode layer at least partially formed over the first dielectric layer;

a second dielectric layer formed at least partially over the second electrode layer;

a third electrode layer at least partially formed over the second dielectric layer, the third electrode layer having a third tapered sidewall at an edge of the third electrode layer;

a passivation layer formed over the first and second tapered sidewalls and the third electrode layer; and a contact hole over the third electrode layer that extends through the passivation layer to the third electrode layer.

18. The multi-layer capacitor of claim 17, wherein the first tapered sidewall forms a downward angle of 30°-60° with respect to a surface of the substrate.

19. The multi-layer capacitor of claim 18, wherein the first tapered sidewall forms a downward angle of 40°-50° with respect to the surface of the substrate.

* * * * *

UNITED STATES PATENT AND TRADEMARK OFFICE
CERTIFICATE OF CORRECTION

PATENT NO. : 8,680,649 B2
APPLICATION NO. : 12/196517
DATED : March 25, 2014
INVENTOR(S) : Guillaume Guegan Page 1 of 1

It is certified that error appears in the above-identified patent and that said Letters Patent is hereby corrected as shown below:

**In the Claims:

At column 6, line 17, Claim 2 should be corrected to delete the following text: "comprising a first".**

Signed and Sealed this
First Day of July, 2014

Michelle K. Lee
*Deputy Director of the United States Patent and Trademark Office*